United States Patent
Ushiyama

(10) Patent No.: US 8,637,387 B2
(45) Date of Patent: Jan. 28, 2014

(54) LAYOUT DESIGN METHOD AND SEMICONDUCTOR INTEGRATED CIRCUIT

(75) Inventor: Kenichi Ushiyama, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 490 days.

(21) Appl. No.: 12/614,833

(22) Filed: Nov. 9, 2009

(65) Prior Publication Data

US 2010/0123252 A1 May 20, 2010

(30) Foreign Application Priority Data

Nov. 14, 2008 (JP) ................................ 2008-291758

(51) Int. Cl.
*H01L 21/20* (2006.01)

(52) U.S. Cl.
USPC ............................ 438/584; 257/773; 716/119

(58) Field of Classification Search
USPC ............................ 438/584; 257/773; 716/119
See application file for complete search history.

(56) References Cited

U.S. PATENT DOCUMENTS

| | | | |
|---|---|---|---|
| 5,221,865 A | 6/1993 | Phillips et al. | |
| 5,331,572 A | 7/1994 | Takahashi | |
| 6,223,329 B1 * | 4/2001 | Ling et al. ..................... | 716/129 |
| 2008/0239780 A1 | 10/2008 | Sasaki et al. | |

FOREIGN PATENT DOCUMENTS

| | | |
|---|---|---|
| JP | 4-171844 | 6/1992 |
| JP | 5-259379 | 10/1993 |
| JP | 5-326712 | 12/1993 |
| JP | 6-508923 | 10/1994 |
| JP | 8-330551 | 12/1996 |
| JP | 2720629 | 11/1997 |
| JP | 2001-127164 | 5/2001 |
| JP | 2007-96216 | 4/2007 |
| JP | 2008-251835 | 10/2008 |

OTHER PUBLICATIONS

Japanese Office Action issued Sep. 11, 2012 in corresponding Japanese Patent Application No. 2008-291758.

* cited by examiner

*Primary Examiner* — Long Pham

(74) *Attorney, Agent, or Firm* — Staas & Halsey LLP

(57) ABSTRACT

A circuit and a method of layout-designing a circuit based on circuit information. The method includes generating layout information including a core region based on the circuit information, laying out an I/O circuit in a region other than the core region on the layout information based on the circuit information, determining a layout-permitted region of pads, which is included in regions other than the core region and a layout region of said I/O circuit, based on circuit information, and laying out the pads in the layout-permitted region.

15 Claims, 19 Drawing Sheets

FIG. 9

| | ZONE NAME | | | | |
|---|---|---|---|---|---|
| | A | B | C | D | TOTAL |
| PT | 6 | 4 | 7 | 7 | 22 |
| WB | 4 | 4 | 5 | 6 | 21 |
| TOTAL | 10 | 8 | 12 | 13 | 43 |

UNIT [PCS.]

LAYOUT DESIGN METHOD AND SEMICONDUCTOR INTEGRATED CIRCUIT

CROSS-REFERENCE TO RELATED APPLICATIONS

This application claims the benefit of priority from Japanese Patent Application No. 2008-291758 filed on Nov. 14, 2008, the entire contents of which are incorporated herein by reference.

BACKGROUND

1. Field

The embodiment(s) discussed herein relates to the layout design of a semiconductor integrated circuit and a layout design method.

2. Description of the Related Art

The number of inputs/outputs (I/Os) has increased along with miniaturization in the process technology of semiconductor integrated circuits and functional upgrading in semiconductor integrated circuits. Thus, the area of a semiconductor integrated circuit is determined by the configuration and the quantity of I/O circuits. Accordingly, a technique of reducing the area of a semiconductor integrated circuit by the layout of I/O circuits is discussed in, for example, Japanese Patent No. 2720629, Japanese Laid-open Patent Publication No. H5-259379, and Japanese Laid-open Patent Publication No. H5-326712.

The area of a semiconductor integrated circuit is also determined by the area of a core region. Such determination is referred to as core regulation. Layout design compliant with core regulation is discussed in, for example, Japanese Laid-open Patent Publication No. 2007-96216.

SUMMARY

According to one aspect of embodiments, an integrated circuit and a method of layout-designing a circuit based on circuit information by a computer is provided. The method includes generating layout information including a core region based on the circuit information, laying out an I/O circuit in a region other than the core region on the layout information based on the circuit information, determining a layout-permitted region of pads, which is included in regions other than the core region and the layout region of said I/O circuit, based on circuit information, and laying out the pads in the layout-permitted region.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 9 illustrates an exemplary required-number-of-laid-out-pads table;

DETAILED DESCRIPTION OF EMBODIMENTS

Figure 1:
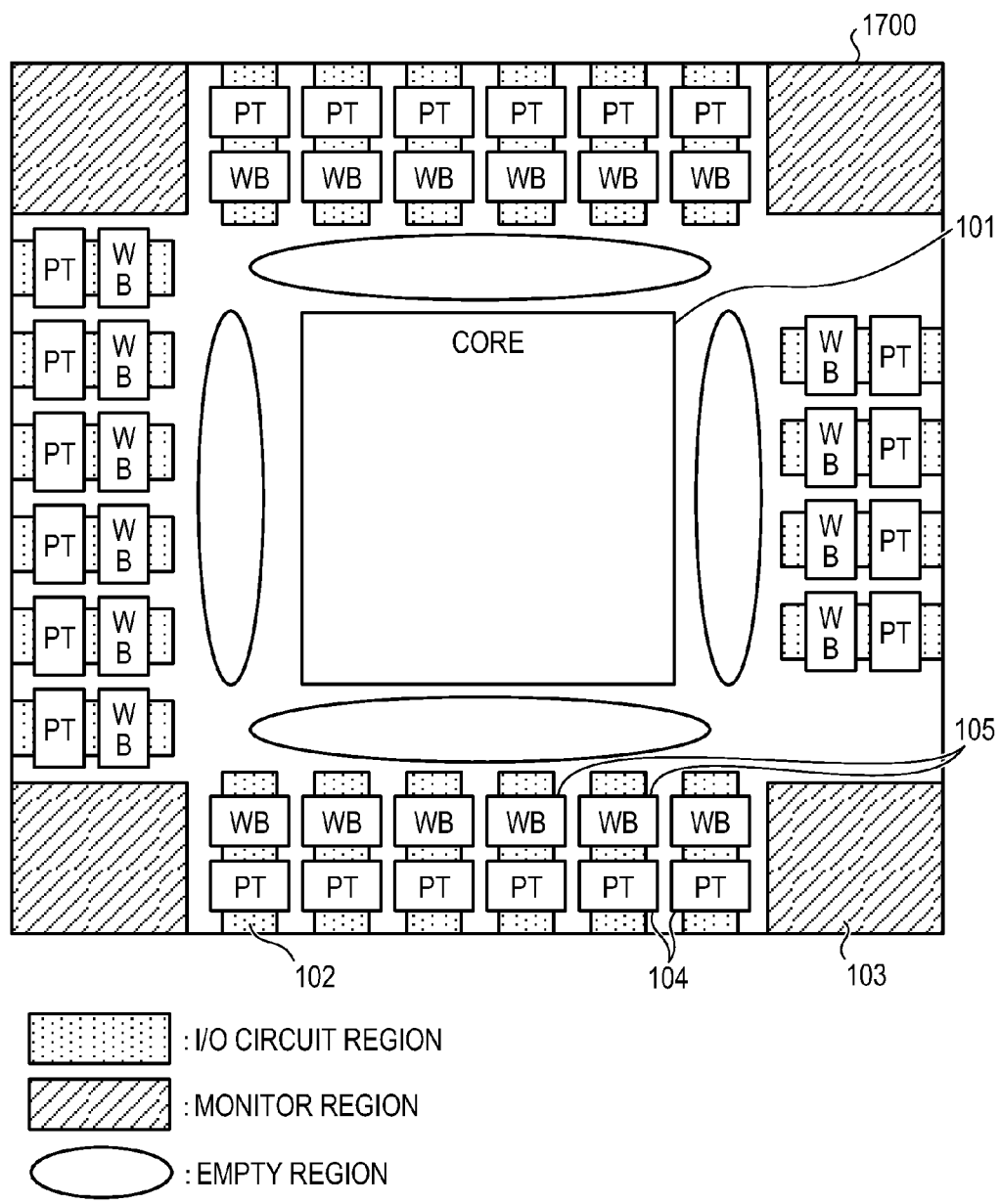
FIG. 1 illustrates an exemplary layout design compliant with pad regulation.

Reference will now be made in detail to the embodiments, examples of which are illustrated in the accompanying drawings, wherein like reference numerals refer to the like elements throughout. The embodiments are described below to explain the present invention by referring to the figures.

Due to a reduction in the area of I/O circuits made by the process technology of semiconductor integrated circuits, the area of a semiconductor integrated circuit is determined by a pad area and a number of pads.

An I/O circuit within a semiconductor integrated circuit includes, for example, two pads. One of the pads is a Primary Test pad (PT pad) with which a probe needle of a semiconductor testing apparatus for performing wafer testing is brought into contact. The other pad is a Wire Bonding pad (WB pad) for bonding for packaging.

FIG. 1 illustrates an exemplary layout design compliant with pad regulation. A core region 101, I/O circuit regions 102, and monitor regions 103 are laid out on layout information 1700 of pad regulation. I/O circuits are laid out in the I/O circuit regions 102.

A PT pad 104 and a WB pad 105, for example, are laid out for one I/O circuit region 102. Since I/O circuits are laid out in accordance with a pad pitch, an empty region exists between adjacent I/O circuit regions 102. An empty region (location enclosed by ○ in FIG. 1) also exists between each I/O circuit region 102 and the core region 101.

Figure 2:
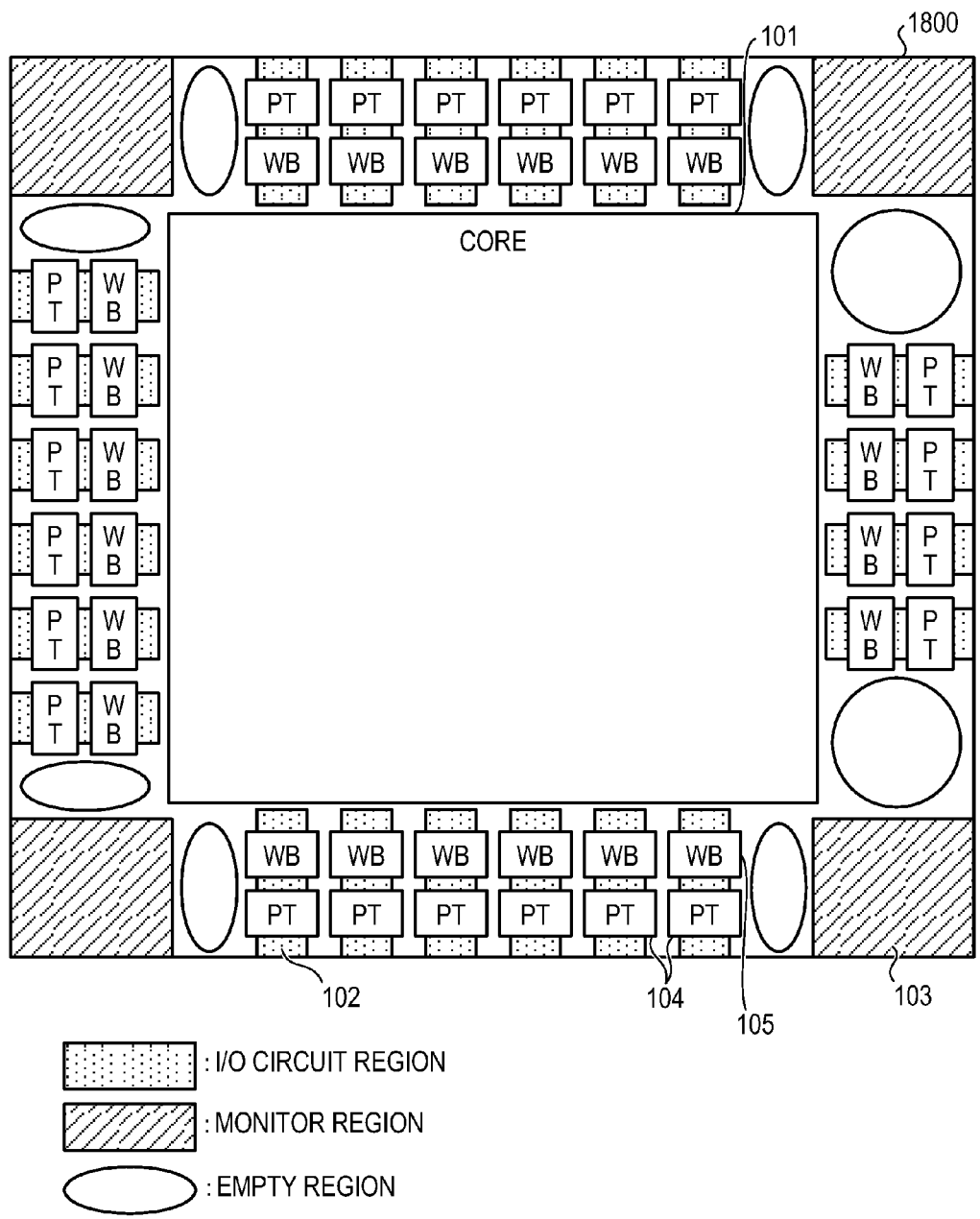
FIG. 2 illustrates an exemplary layout design compliant with core regulation.

FIG. 2 illustrates an exemplary layout design compliant with core regulation.

Since the number of I/O circuits, the number of PT pads 104 and the number of WB pads 105 are insufficient for a core region 101 on layout information 1800 of core regulation, there may be produced empty regions (locations enclosed by ○ in FIG. 1) on a semiconductor integrated circuit.

The circuit of the core region and the I/O circuits are laid out according to input circuit information to determine a layout-permitted region of pads. The layout-permitted region of pads is identified (designated) and empty regions may reduce in accordance therewith. When the area of the layout-permitted region is larger than a total area of a required number of laid-out pads, optimization may be performed so that a pad area becomes larger. The empty regions of the semiconductor integrated circuit may be utilized efficiently.

Accordingly, an area of the semiconductor integrated circuit may be reduced by reducing empty regions. Wire bonding may be facilitated by optimizing pads. Testing may be facilitated by an easiness for applying a probe needle, thereby improving test accuracy.

Figure 3:
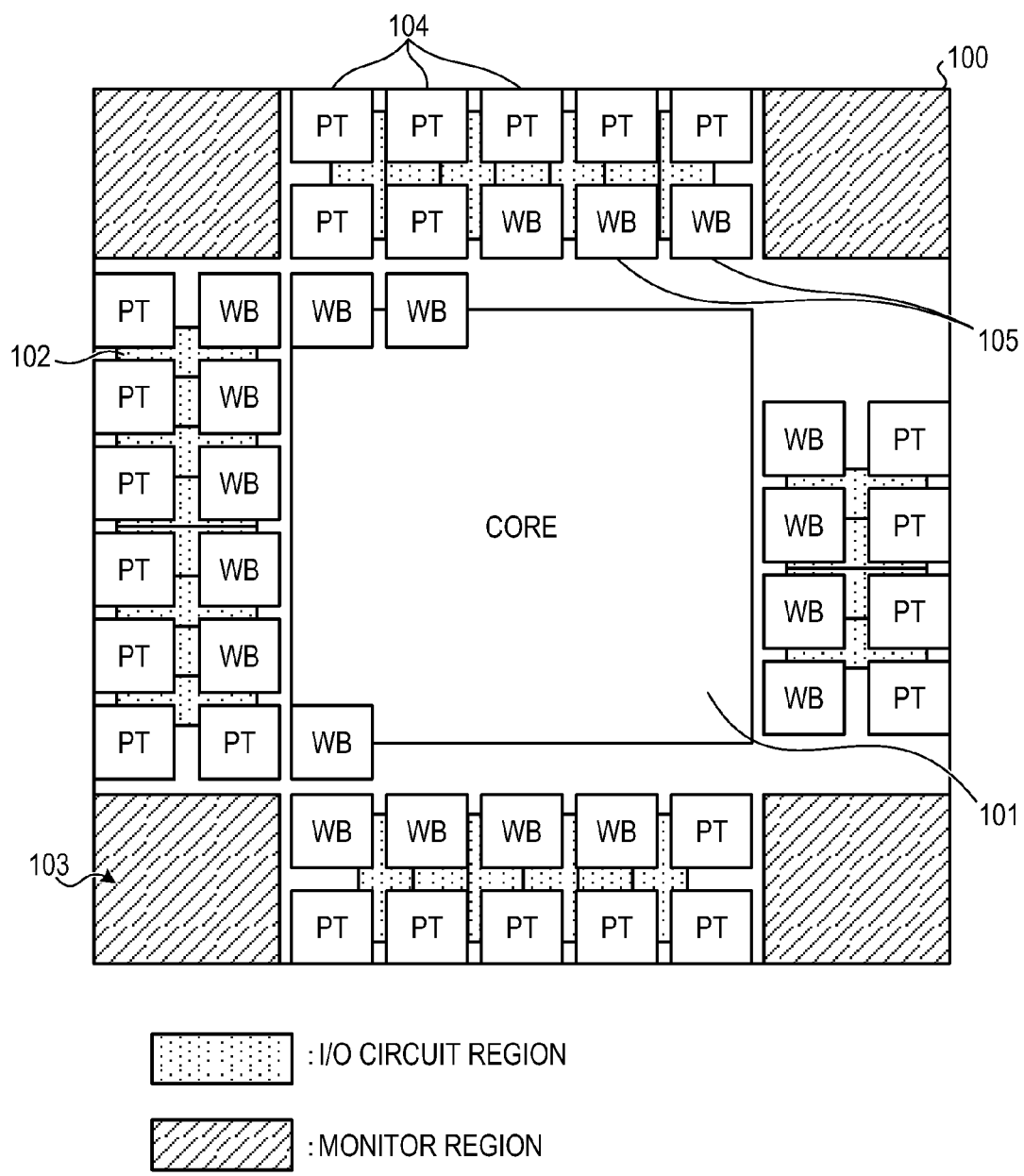
FIG. 3 illustrates an embodiment.

FIG. 3 illustrates an embodiment. A core region 101, I/O circuit regions 102, monitor regions 103, PT pads 104, and WB pads 105 are laid out on layout information 100 of a semiconductor integrated circuit. In each monitor region 103, for example, a transistor, which measures the characteristics or information of the semiconductor integrated circuit, is provided.

The interconnect of each I/O circuit region 102 is a lower-layer interconnect. Pads are formed in an interconnect upper than the interconnect of each I/O circuit region. The core region which overlaps with the pads is formed in an interconnect lower than the interconnect of the pads. Accordingly, the pads are laid out in regions other than (separate, different or independent) the I/O circuit regions and the core region.

An I/O circuit may have a required number of pads. The pads may not be laid out on I/O circuit regions 102 to which the pads are coupled. Accordingly, empty regions which may be produced due to pad regulation are reduced.

In an embodiment, empty regions produced due to core regulation are utilized by increasing the pad area.

Figure 4:
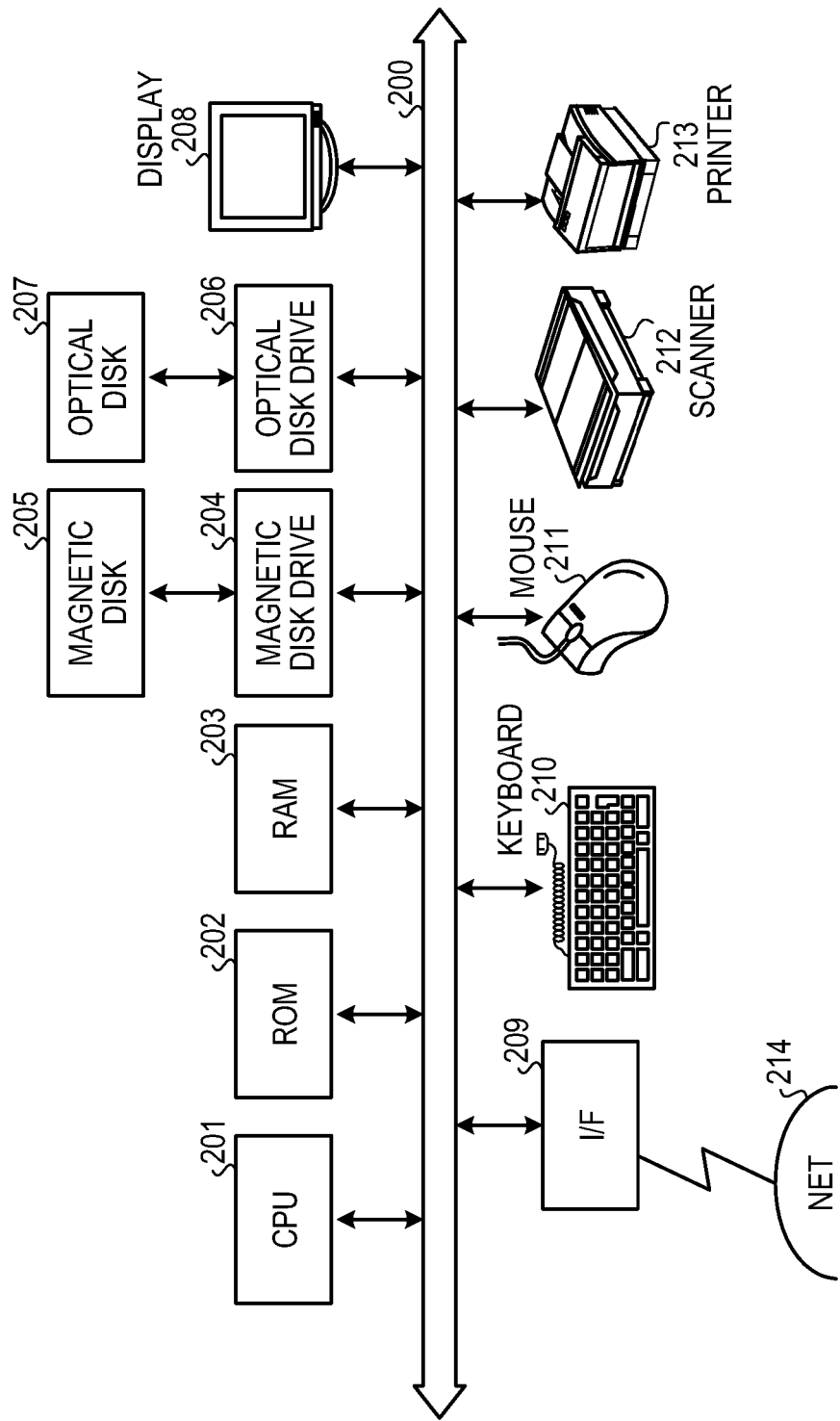
FIG. 4 illustrates an exemplary layout design apparatus.

FIG. 4 illustrates an exemplary layout design apparatus. The layout design apparatus includes a Central Processing Unit (CPU) 201, a Read-Only Memory (ROM) 202, a Random Access Memory (RAM) 203, a magnetic disk drive 204, a magnetic disk 205, an optical disk drive 206, an optical disk 207, a display 208, an interface (I/F) 209, a keyboard 210, a mouse 211, a scanner 212, and a printer 213. The respective elements are interconnected through a bus 200. While particular elements/components of the layout design apparatus are illustrated in FIG. 4, any of the operations of the elements may be integrated and implemented via a single element/component.

The CPU 201 controls the entire layout design apparatus. The ROM 202 stores information including programs, such a boot program. The RAM 203 is used as a work area of the CPU 201. The magnetic disk drive 204 controls data read/write operation on the magnetic disk 205 according to the control by the CPU 201. The magnetic disk 205 stores data written by the control of the magnetic disk drive 204.

The optical disk drive 206 controls data read/write operation on the optical disk 207 according to the control by the CPU 201. The optical disk 207 stores data written by the control of the optical disk drive 206. A computer, for example, reads data stored in the optical disk 207.

The display 208 displays data including a cursor, icons or toolboxes, as well as documents, images, and data such as function information. Examples of the display 208 include a CRT display, a TFT liquid crystal display, a plasma display, etc.

The interface (I/F) 209 is coupled to a network 214, such as a Local Area Network (LAN), a Wide Area Network (WAN) or the Internet, through a communications line, and is further coupled to other equipments through the network 214. As an interface between the network 214 and the internal network of the layout design apparatus, the I/F 209 controls the input/output of data from external equipments. Examples of the I/F 209 include a modem and a LAN adapter.

The keyboard 210 includes keys for inputting letters, numerals, various commands and the like, whereby data input is performed. A touch-panel input pad, a tenkey numeric keypad, and the like, may also be coupled. The mouse 211 is used to, for example, move the cursor, select a range, and move or resize windows. A trackball, a joystick or the like may be coupled instead if as a pointing device, the trackball, the joystick or the like has substantially the same functions as the mouse.

The scanner 212 optically reads images and loads them into the layout design apparatus. The scanner 212 may have an Optical Character Reader (OCR) function. The printer 213 prints image data and document data. Examples of the printer 213 include a laser printer and an ink-jet printer.

Figure 5:
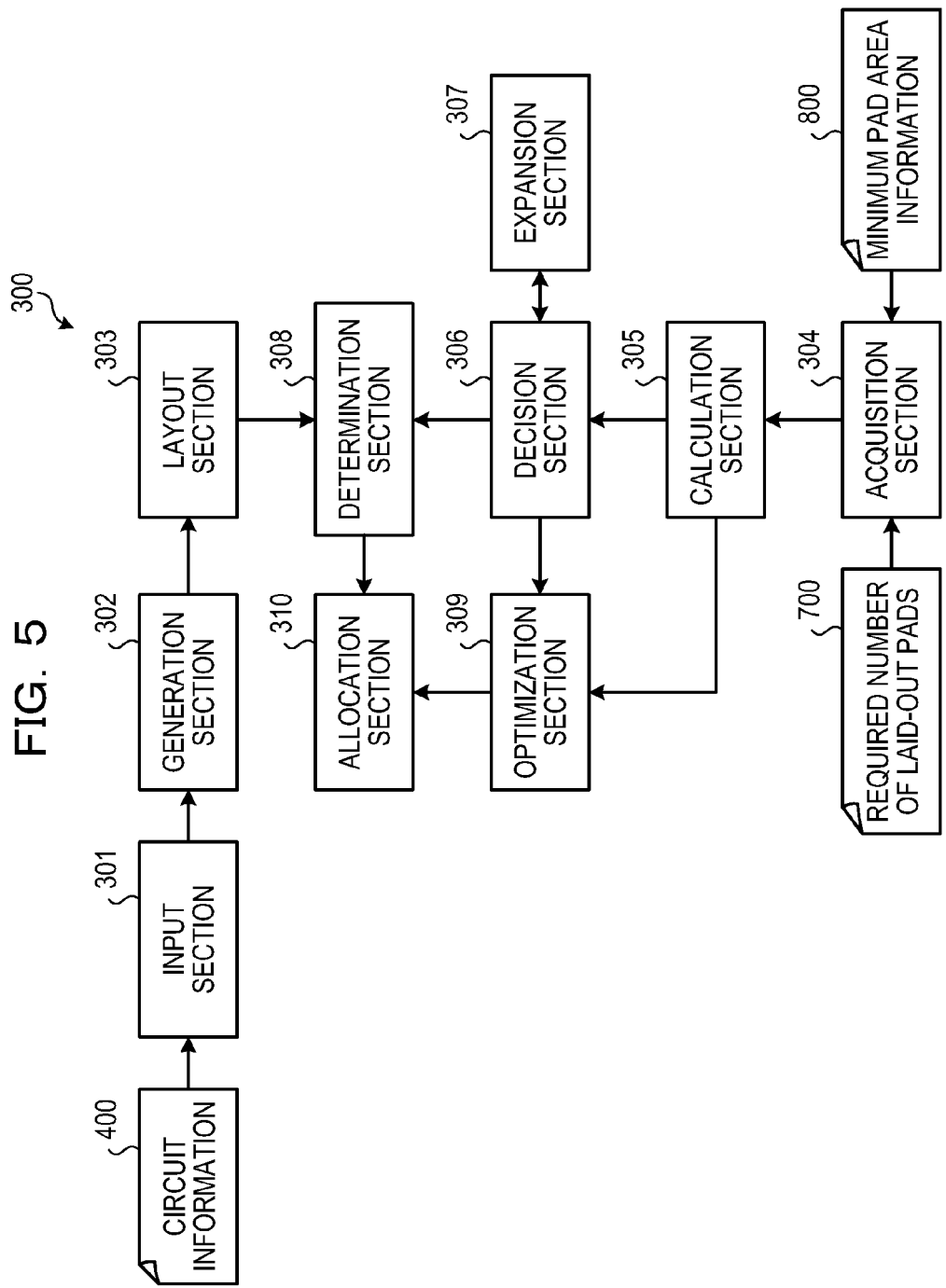
FIG. 5 illustrates another exemplary layout design apparatus.

FIG. 5 illustrates another exemplary layout design apparatus. A layout design apparatus 300 includes an input section 301, a generation section 302, a layout section 303, an acquisition section 304, a calculation section 305, a decision section 306, an expansion section 307, a determination section 308, an optimization section 309, and an allocation section 310.

The input section 301 receives data on circuit information. The circuit information includes information on an original source of layout information and may be, for example, information on connection (netlist) among circuits within a semiconductor integrated circuit being designed. The circuit information may be input using a keyboard or mouse operation. Alternatively, the CPU 201 may read the circuit information from a memory, such as the RAM 203, the magnetic disk 205 or the optical disk 207. Still alternatively, the circuit information may be input from the I/F 209. The input circuit information 400 is stored in, for example, the memory. While specific information is referred to herein as circuit information, the present invention is not limited to any particular type of information and may include any data related to circuits to be integrated during design.

Figure 6:
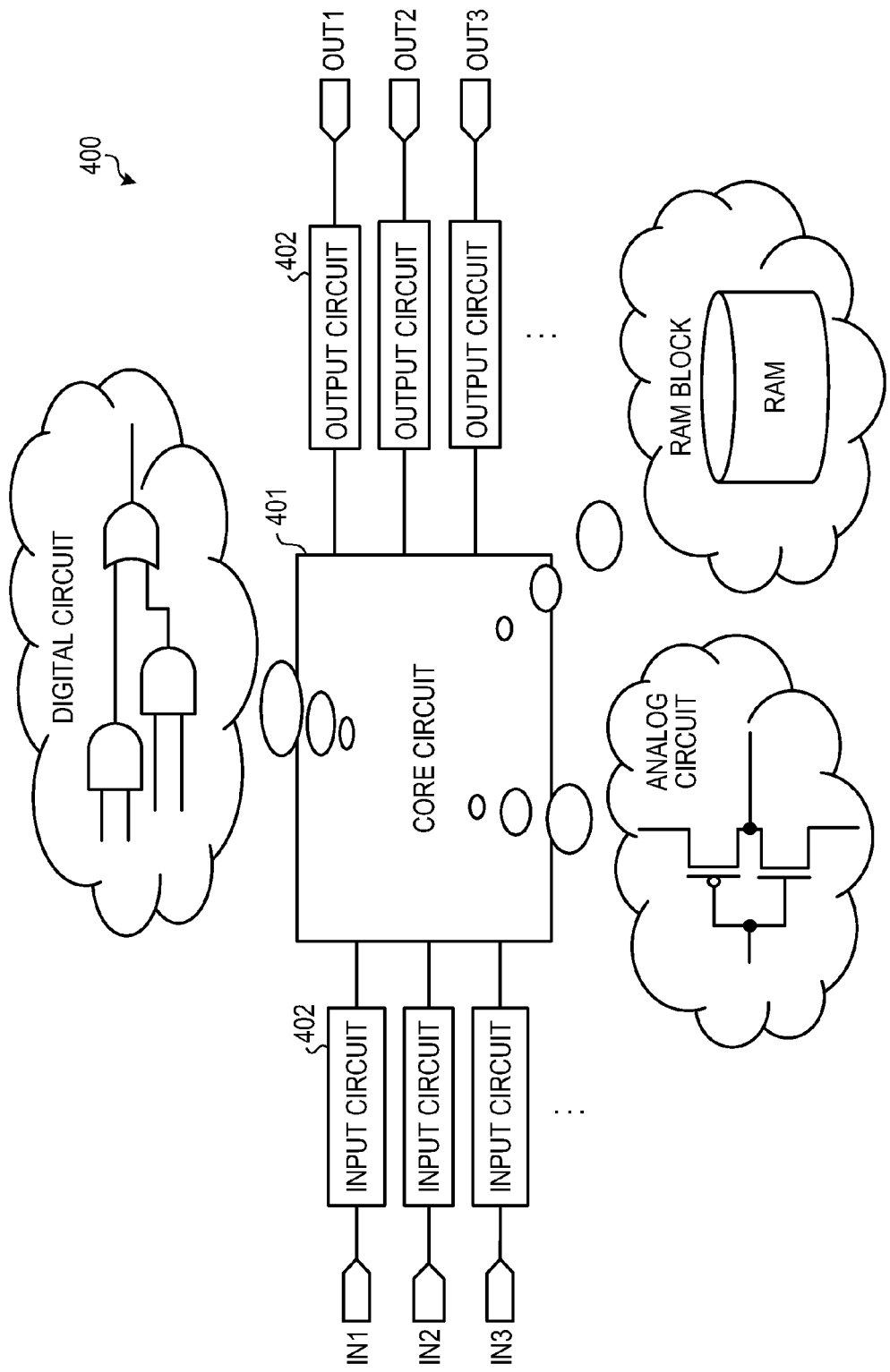
FIG. 6 illustrates an exemplary circuit information.

FIG. 6 illustrates exemplary circuit information. Circuit information 400 includes text data represented by a netlist, but is illustrated here as a virtual image for ease of understanding. The circuit information 400 includes information on a core circuit 401 and I/O circuits 402. The core circuit 401 includes circuit blocks, such as a digital circuit, an analog circuit and a RAM. The core circuit 401 is laid out in a core region 101.

The generation section 302 illustrated in FIG. 5 generates layout information on the core region 101 included in the input circuit information 400. The CPU 201, for example, draws the layout region of a semiconductor integrated circuit of a given size in a memory. The CPU 201 reads the circuit information 400 from the memory and draws the core circuit 401 in the layout region of the semiconductor integrated circuit. The layout region of the semiconductor integrated circuit in which the core circuit 401 has been drawn corresponds to layout information 100. The layout information 100 is stored in the memory.

Figure 7:
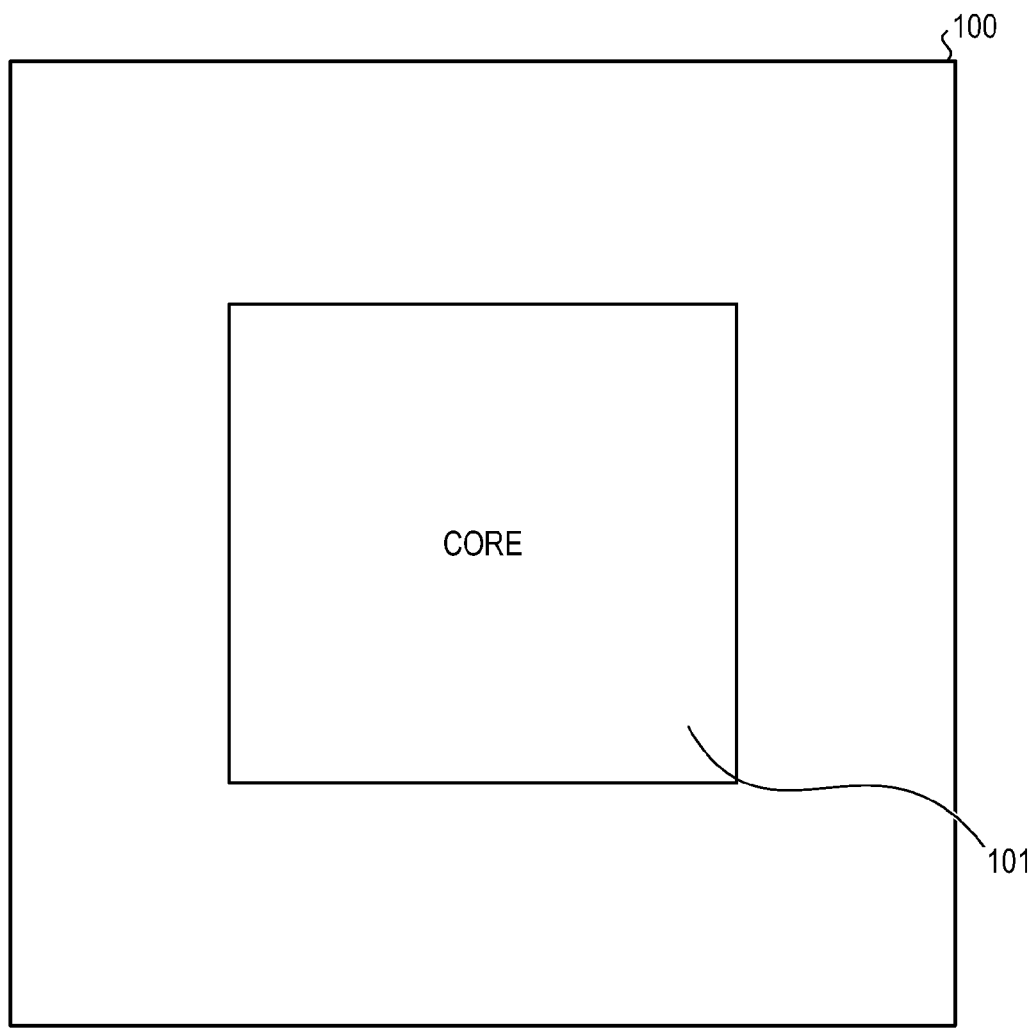
FIG. 7 illustrates an exemplary layout information.

FIG. 7 illustrates exemplary layout information. The layout information illustrated in FIG. 7 may be generated by, for example, the generation section 302 illustrated in FIG. 5. First, layout information 100 of a semiconductor integrated circuit is generated. Next, a core circuit 401 is laid out on the layout information 100 of the semiconductor integrated circuit and interconnection is performed. In FIG. 7, a core region 101 exists on the layout information 100 of the semiconductor integrated circuit.

The layout section 303 illustrated in FIG. 5 lays out the I/O circuits 402 included in the circuit information 400. The CPU 201, for example, reads the circuit information 400 from the memory and specifies the layout region of the I/O circuits 402 on layout information 100. The CPU 201 determines the layout position of each I/O circuit 402, i.e., the coordinates thereof. The CPU 201 locates the I/O circuits 402 on the layout information 100 of the semiconductor integrated circuit according to the coordinates.

Figure 8:
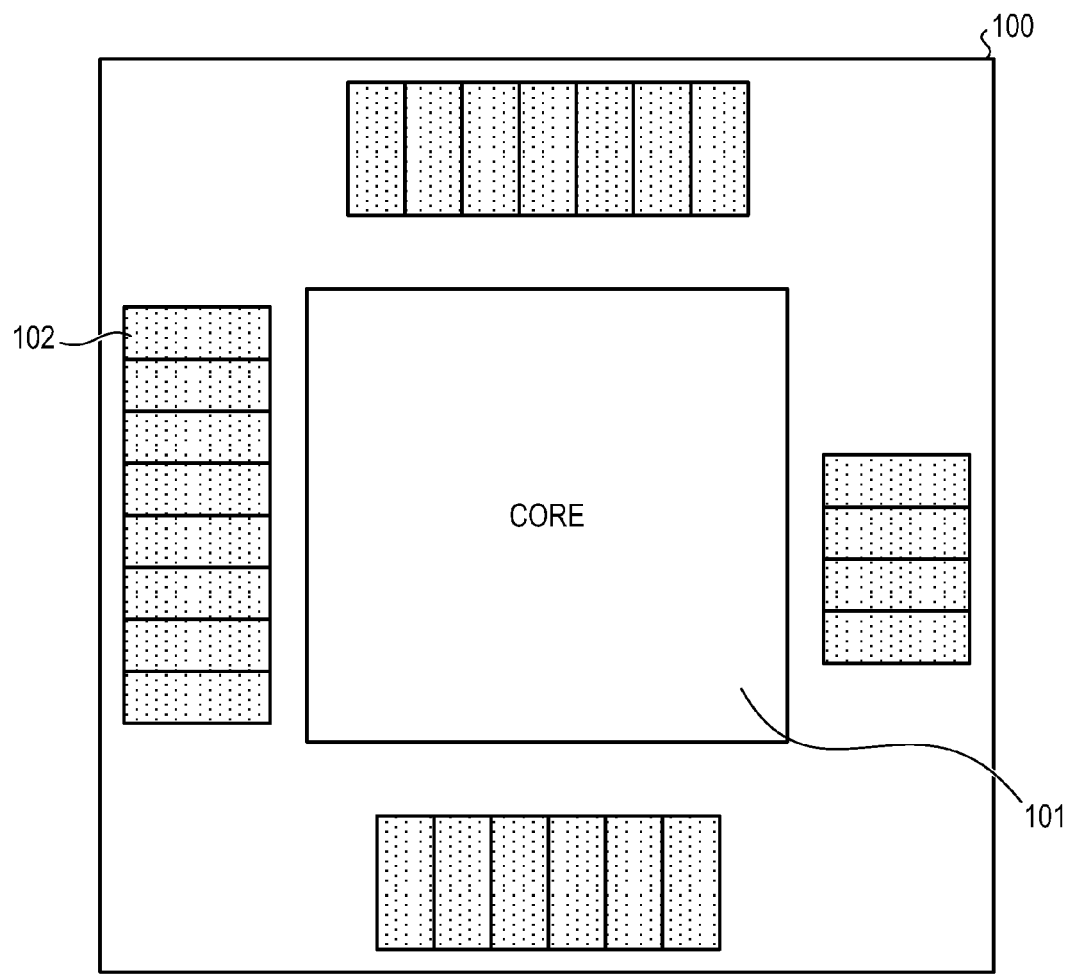
FIG. 8 illustrates an exemplary layout information.

FIG. 8 illustrates exemplary layout information. The layout information illustrated in FIG. 8 may be generated in the layout section 303 illustrated in FIG. 5 and may include laid-out I/O circuits 402. The I/O circuits 402 included in circuit information 400 are laid out in I/O circuit regions 102 on layout information 100 of a semiconductor integrated circuit. Since the I/O circuits 402 are laid out irrespective of (independent of) the layout positions of pads, an empty region does not exist between adjacent I/O circuit regions 102.

The acquisition section 304 illustrated in FIG. 5 acquires a required laid-out number of pads and minimum pad area information. The required laid-out number of pads refers to a sum of a total number of PT pads 104 and the total number of WB pads 105 to be laid out on the semiconductor integrated circuit. The minimum pad area information includes information used to identify the minimum area of the pads and includes information of vertical and horizontal lengths of the pad or the pad area. The minimum pad area information is determined according to, for example, bonding and probing conditions. The required laid-out number of pads and the minimum pad area information may be transmitted from external equipment or may be read from a memory, such as the RAM 203, the magnetic disk 205 or the optical disk 207 illustrated in FIG. 4.

FIG. 9 illustrates an exemplary required-laid-out-number-of-pads table. The required-laid-out-number-of-pads table 700 includes, for example, the A to D zones of a layout-permitted region and retains the laid-out number of PT pads 104 and the laid-out number of WB pads 105. The required-laid-out-number-of-pads table 700 retains the total laid-out number of PT pads 104 and the total laid-out number of WB pads 105. The required-laid-out-number-of-pads table 700 may be stored in, for example, a memory, such as the RAM 203, the magnetic disk 205 or the optical disk 207 illustrated in FIG. 4.

Figure 10:
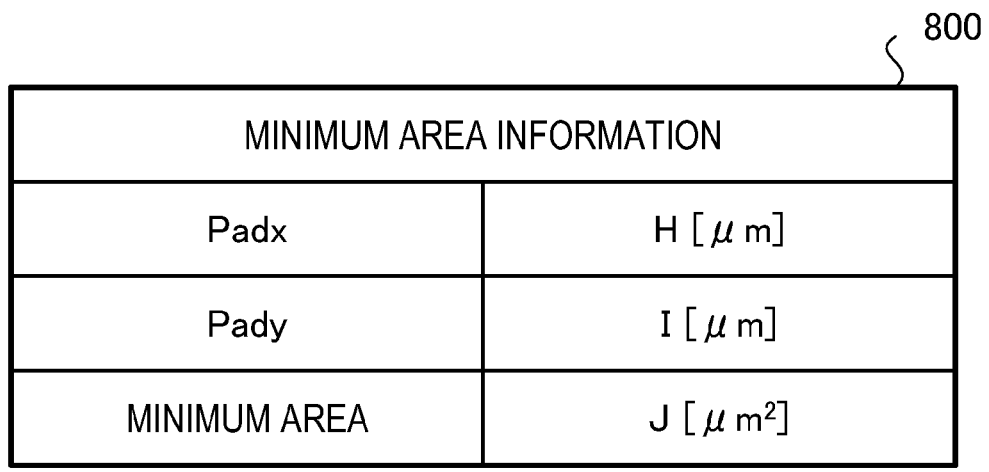
FIG. 10 illustrates an exemplary minimum-pad-area-information table.

FIG. 10 illustrates an exemplary minimum-pad-area-information table. A minimum area information table 800 retains minimum pad area information. The minimum pad area information is determined according to a pad area where bonding is possible and a pad area where a probe needle may be contacted with a pad.

"Padx" (for example, a vertical length) and "Pady" (for example, a horizontal length) retained by the minimum area information table 800 may be the lengths of sides of a rectangular pad. The minimum area is calculated using the following equation.

Minimum area=$Padx \times Pady$

The minimum area information table 800 is stored in, for example, a memory, such as the RAM 203, the magnetic disk 205 or the optical disk 207 illustrated in FIG. 4.

The calculation section 305 illustrated in FIG. 5 calculates the total area of the required laid-out number of pads using information on the required laid-out number of pads and minimum pad area information that are acquired by the acquisition section 304. The CPU 201, for example, calculates the total area of the required laid-out number of pads using the following equation. Calculation results are retained in, for example, a memory, such as the RAM 203, the magnetic disk 205 or the optical disk 207 illustrated in FIG. 4.

Total area of required laid-out number of pads=Required laid-out number of pads×Pad area The calculation section 305 calculates the area of a layout-permitted region of pads. The CPU 201, for example, identifies a pad layout-prohibited region determined by bonding and probing constraints information. A region obtained by subtracting the pad layout-prohibited region and the monitor regions 103 from the layout region of a semiconductor integrated circuit are defined as the layout-permitted region.

The layout-permitted region is divided for each side. The coordinates of an end-point of each divided zone are evaluated. The area of each zone is evaluated based on the coordinates, and the areas of all zones are summed up to calculate the area of the layout-permitted region. Calculation results are retained in, for example, a memory, such as the RAM 203, the magnetic disk 205 or the optical disk 207 illustrated in FIG. 4.

Figure 11:
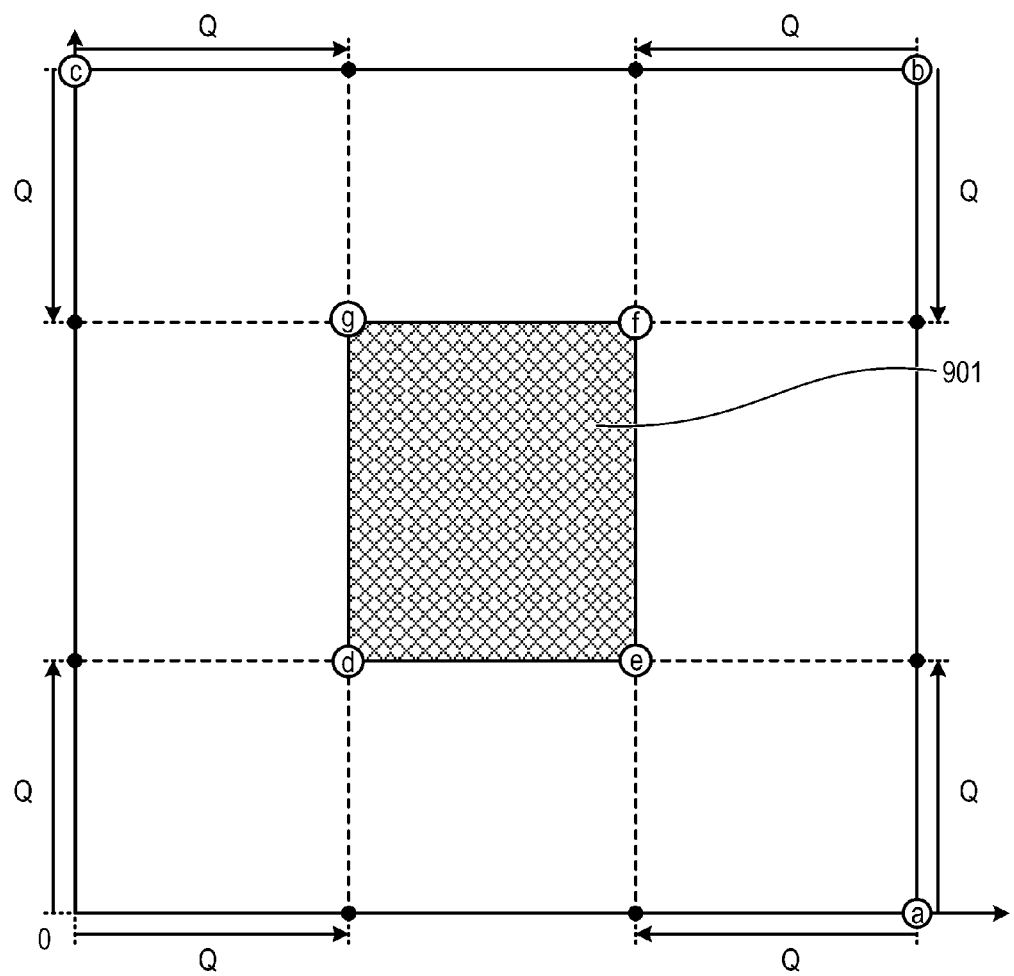
FIG. 11 illustrates an exemplary pad layout-prohibited region.

FIG. 11 illustrates an exemplary pad layout-prohibited region. The region having points "d", "e", "f" and "g" as its vertices is a layout-prohibited region 901, and pads are not laid out in the layout-prohibited region 901. The coordinates of the points "d", "e", "f" and "g" are determined by, for example, bonding and probing constraints.

Figure 13:
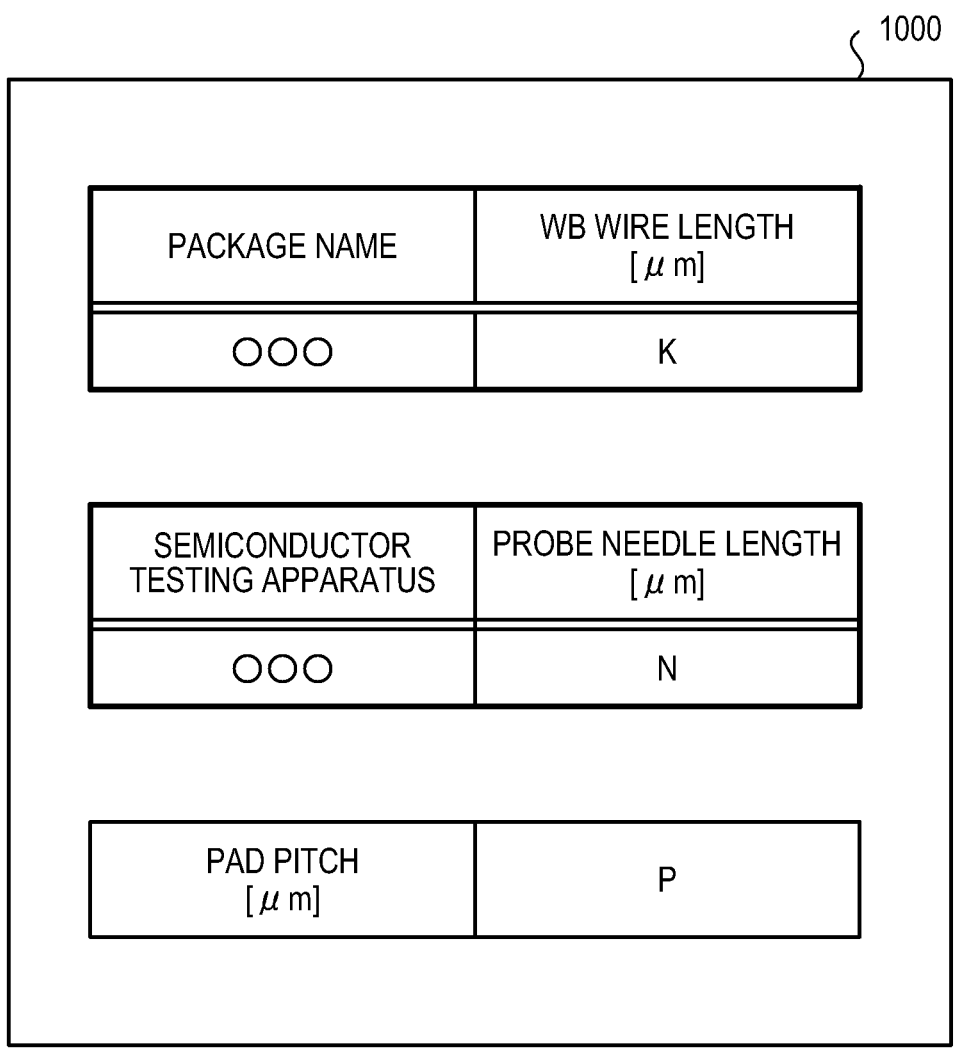
FIG. 13 illustrates exemplary bonding and probing constraints.

FIG. 13 illustrates an exemplary bonding and probing constraints. A constraints table 1000 stores bonding and probing constraints on pad layout and a pad pitch. The bonding constraints include bondable wire lengths. The probing constraints include the length of a probe needle. The constraints table 1000 is stored in, for example, a memory, such as the RAM 203, the magnetic disk 205 or the optical disk 207 illustrated in FIG. 4.

In FIG. 13, a bonding wire length "K" [μm] and a probe needle length "N" [μm] are read from the constraints table 1000. The values of "K" [μm] and "N" [μm] are compared and the smaller of the values is defined as Q [μm]. Since the layout-prohibited region 901 is identified based on "Q", the layout-prohibited region 901 is identified irrespective of the type of pads. Accordingly, processing is performed at higher speeds, compared with a speed at which the layout-prohibited region 901 is identified based on the type of pads.

The coordinates of, for example, a point "d" is evaluated. The coordinates of the point "d" is "Q" [μm] away in an X-axis direction and "Q" [μm] away in a Y-axis direction toward the inside of the layout region from a point of origin that is a vertex of a semiconductor integrated circuit layout region. In addition, the coordinates of points "e", "f" and "g" are evaluated. The coordinates of points "e", "f" and "g" are "Q" [μm] away in an X-axis direction and "Q" [μm] away in a Y-axis direction from points "a", "b" and "c", respectively, which are vertices of the semiconductor integrated circuit layout region. A region having the points "d", "e", "f" and "g" as its vertices is the layout-prohibited region 901. The layout-prohibited region 901 is retained in, for example, a memory, such as the RAM 203, the magnetic disk 205 or the optical disk 207 illustrated in FIG. 4.

Since the layout-prohibited region 901 is identified by a value including "K", bonding is not performed in the layout-prohibited region 901 even if pads are laid out therein. Since the layout-prohibited region 901 is also identified by a value including "N", contact by a probe needle is not performed in the layout-prohibited region 901 even if pads are laid out therein. A layout-permitted region is identified based on the layout-prohibited region 901 and thus the area of the layout-permitted region is calculated.

Figure 12:
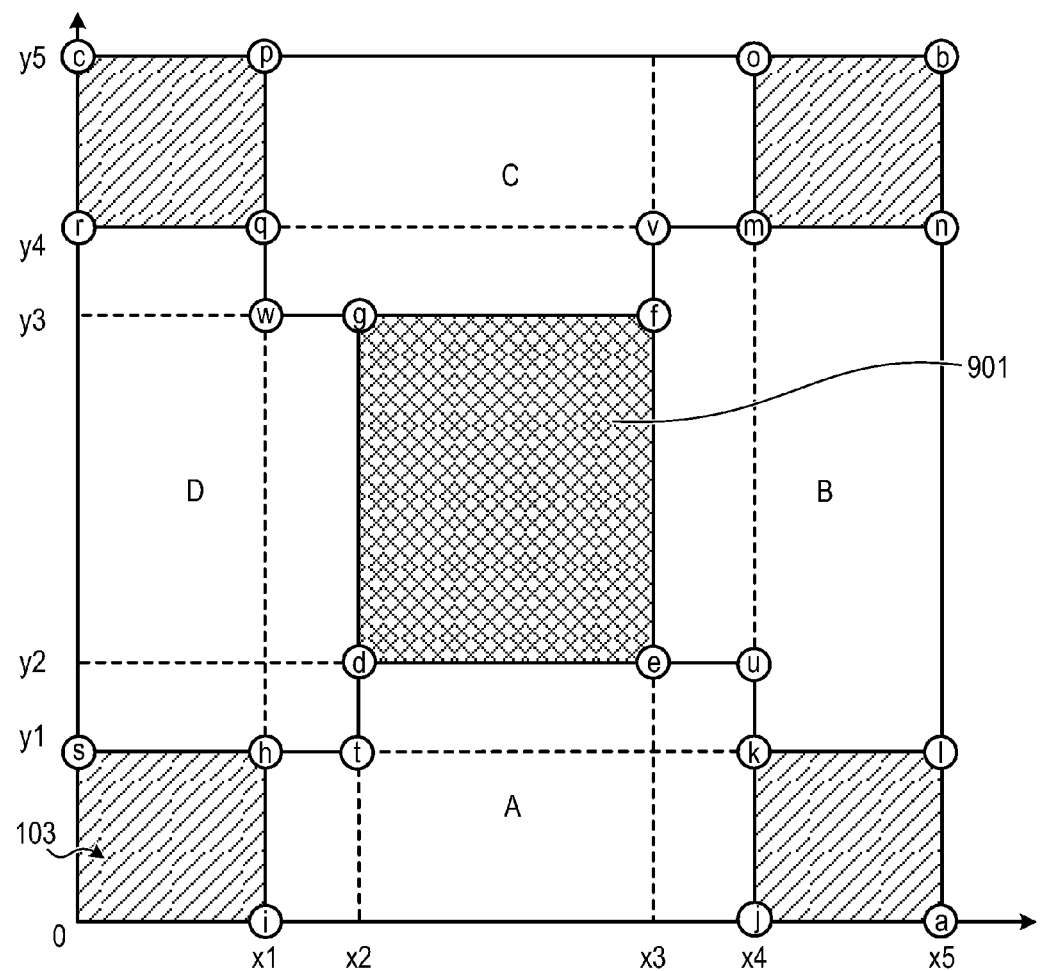
FIG. 12 illustrates an exemplary layout-permitted region of pads.

FIG. 12 illustrates an exemplary layout-permitted region of pads. A region divided into A to D zones is the layout-permitted region. For example, the A zone is a region having points "i", "j", "u", "d", "t" and "h" as its vertices. The B zone is a region having points "k", "l", "n", "v", "e" and "u" as its vertices. The C zone is a region having points "m", "o", "p", "w", "f" and "v" as its vertices. The D zone is a region having points "q", "r", "s", "t", "g" and "w" as its vertices.

In a monitor region 103, pads are not laid out. Accordingly, the layout-permitted region is a region obtained by excluding the layout-prohibited region 901 and the monitor regions 103 from the layout region of a semiconductor integrated circuit.

Since the layout-permitted region is determined based on a wire length specified for wire bonding, the layout-permitted region varies depending on the wire length. Accordingly, appropriate wire bonding is performed using a wire having the specified length. The layout-permitted region varies depending on a needle length specified for probing. Accordingly, appropriate testing is performed using a needle having the specified length.

The area of the layout-permitted region is calculated. For example, the A to D zones are regions obtained by dividing the layout-permitted region into four zones for each side. The areas of the A to D zones are calculated by evaluating the coordinates of the end-points of the respective zones.

The area of the A zone, for example, is calculated as described below. The A zone includes two rectangles. One of the rectangles has points "i", "j", "k" and "h" as its vertices. The other rectangle has points "t", "k", "u" and "d" as its vertices.

The coordinates of the vertices of the A zone are as follows: coordinates of vertex "i"=(x1, 0), coordinates of vertex "j"= (x4, 0), coordinates of vertex "k"=(x4, y1), coordinates of vertex "h"=(x1, y1), coordinates of vertex "t"=(x2, y1), coordinates of vertex "u"=(x4, y2), and coordinates of vertex "d"=(x2, y2).

The areas of the two rectangles are evaluated using coordinates and summed up to calculate the area of the A zone. That is, area of A zone=(x4−x1)×y1+(x4−x2)×(y2−y1).

Likewise, the areas of the B to D zones are evaluated. Then, the areas are summed up to calculate the area of the layout-permitted region.

In FIG. 5, the decision section 306 decides whether a required laid-out number of pads is laid out in a layout-permitted region or not. The CPU 201, for example, compares the total area of the required laid-out number of pads with the area of the layout-permitted region. If the layout-permitted region of the pads is smaller than the total area of the laid-out required number of pads, then a decision is made that the required laid-out number of pads may not be laid out in the layout-permitted region.

If the area of the layout-permitted region of the pads is equal to or larger than the total area of the required laid-out number of pads, then a decision is made that the required laid-out number of pads may be laid out in the layout-permitted region.

If the decision section 306 decides that the required laid-out number of pads may not be laid out in the layout-permitted region, then the expansion section 307 expands the layout-permitted region. For example, the layout-permitted region is expanded by the horizontal length Pady [µm] of a pad in the Y-axis direction. Likewise, for example, the layout-permitted region is expanded by the vertical length Padx [µm] of a pad in the X-axis direction.

The CPU 201, for example, repeats the processing of the decision section 306 and the processing of the expansion section 307 until the area of the layout-permitted region of pads equals the total area of the laid-out number of pads. Since the layout-permitted region is expanded minimally, unnecessary empty regions may be reduced, thereby reducing the area of a semiconductor integrated circuit. In addition, since the layout-permitted region corresponding to a minimum area is automatically determined, any shortage of layout regions is prevented.

The determination section 308 determines a layout-permitted region based on the decision made by the decision section 306. The CPU 201, for example, determines the layout-permitted region if the decision section 306 decides that the required laid-out number of pads may be laid out in the layout-permitted region. Data on the determined layout-permitted region is stored in, for example, a memory, such as the RAM 203, the magnetic disk 205 or the optical disk 207 illustrated in FIG. 4. Since the determination section 308 determines the layout-permitted region on the basis of the results of decision made by the decision section 306, functions are simplified and pad layout processing is speeded up.

If the decision section 306 decides that the required laid-out number of pads may be laid out in the layout-permitted region, then the optimization section 309 adjusts the area of each of the pads to an optimum size so that the required laid-out number of pads may be laid out in the layout-permitted region. The CPU 201, for example, increases Padx, which is the vertical side length of a rectangular pad, by $\Delta ax$ [µm] (for example, 1 [µm]) and Pady, which is the horizontal side length of the rectangular pad, by $\Delta by$ [µm] (for example, 1 [µm]), each time a decision is made that the required laid-out number of pads may be laid out in the layout-permitted region. The pad area is calculated using the following equation.

$$\text{Pad area} = (\text{Pad}x + \Delta ax) \times (\text{Pad}y + \Delta by)$$

The total area of the laid-out required number of pads is smaller than the area of the layout-permitted region, and the maximum available area at which the pads may be laid out substantially equals the pad area.

Figure 14:
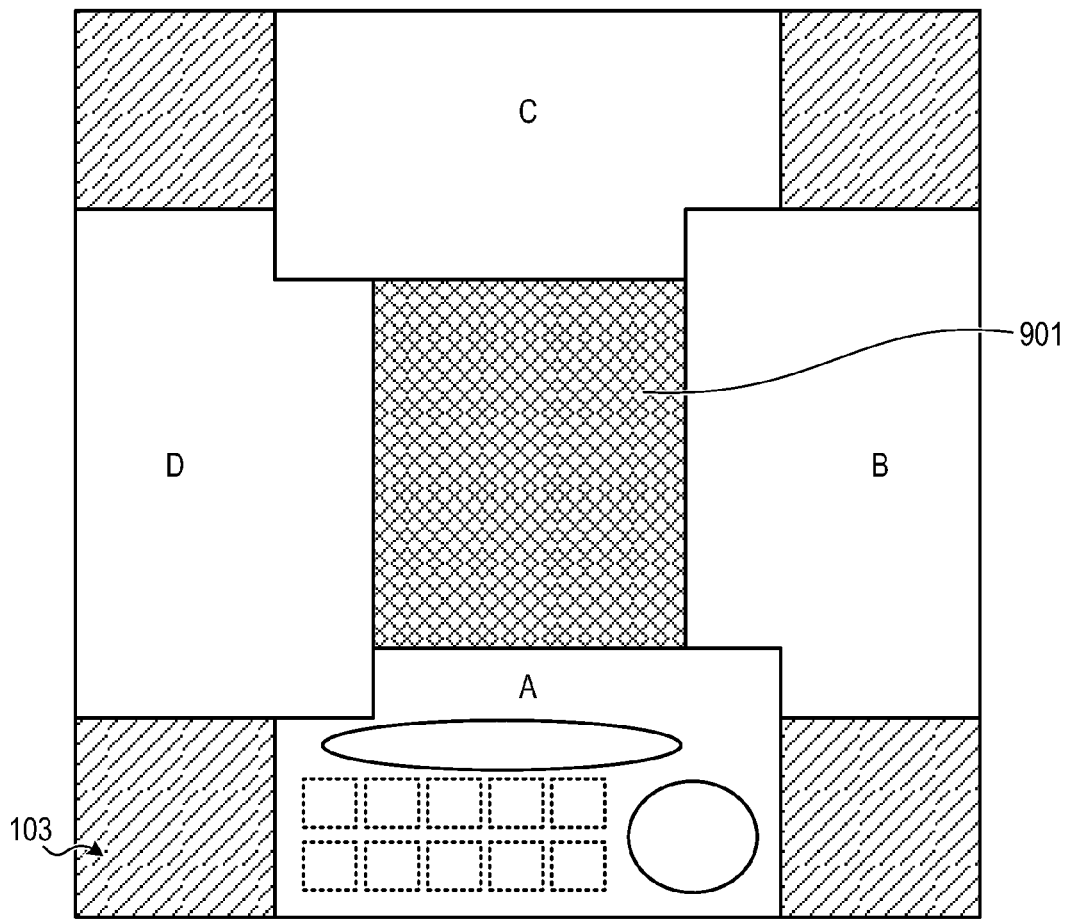
FIG. 14 illustrates an exemplary layout-permitted region.

FIG. 14 illustrates an exemplary layout-permitted region. The area of a semiconductor integrated circuit is determined based on, for example, core regulation. Accordingly, if the area of the layout-permitted region is larger than the total area of the required laid-out number of pads, an empty region (location enclosed by ○ in FIG. 14) may be produced in the layout-permitted region.

Figure 15:
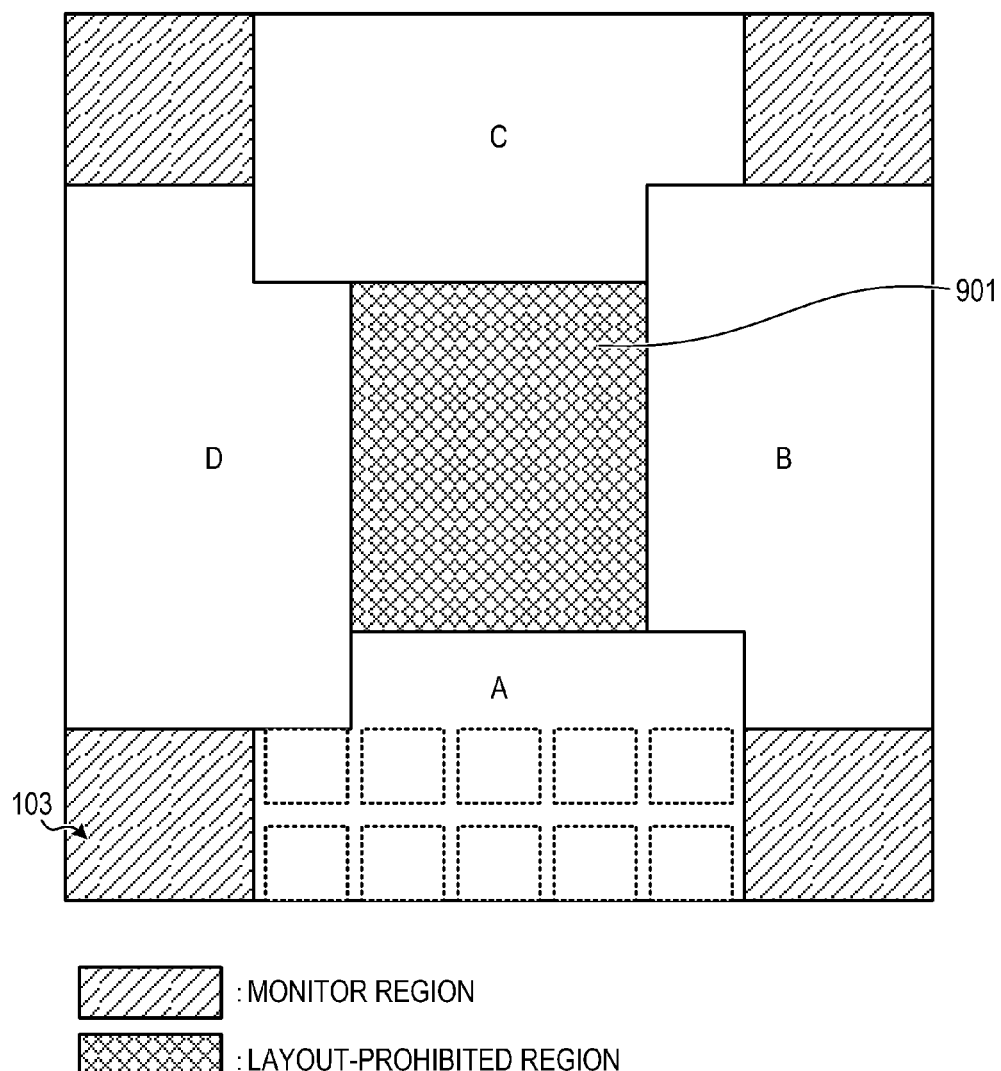
FIG. 15 illustrates another exemplary layout-permitted region.

FIG. 15 illustrates another exemplary layout-permitted region. The empty region is reduced as the result that pads, the area of which has been optimized, are laid out in the layout-permitted region.

In FIG. 5, the allocation section 310 lays out pads, the area of which has been optimized by the optimization section 309, in a layout-permitted region determined by the determination section 308. The CPU 201, for example, reads a required laid-out number of pads from the required-laid-out-number-of-pads table 700. The CPU 201 reads a pad pitch from the constraints table 1000 and lays out the required laid-out number of pads on layout information 100 so that the pads align at an equal space larger than the pad pitch.

The layout positions of PT pads 104 are determined. For example, the PT pads 104 are laid out adjacent to one another. In addition, the layout positions of WB pads 105 are determined. For example, the WB pads 105 are laid out adjacent to one another. After the layout positions are determined, the pads are laid out.

Figure 16:
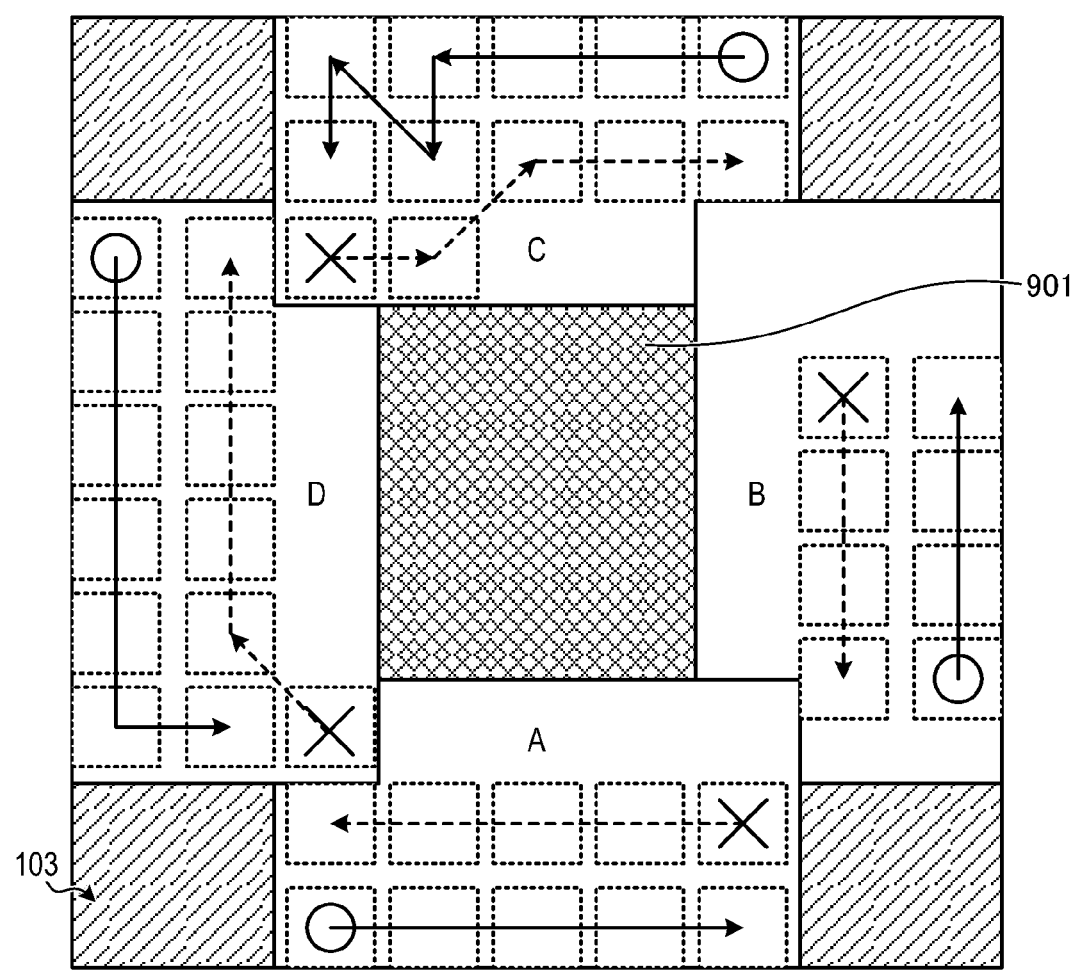
FIG. 16 illustrates an exemplary process of determining pad layout positions.

FIG. 16 illustrates an exemplary process of determining pad layout positions. Pads to be laid out may include PT pads 104 and WB pads 105. A pad pitch "P" is read out from a constraints table 1000. Pads, which are optimized by an optimization section 309 so that a space between pads is equal to or larger than the pad pitch "P", are laid out on layout information 100. A required laid-out number of PT pads 104 and a required laid-out number of WB pads 105 are read out from a required-number-laid-out-of-pads table 700.

The layout of the PT pads 104 is determined. The layout of the PT pads 104 is determined so that the pads are adjacent to one another. Accordingly, it becomes easy to apply a probe needle, thereby simplifying tests and improving test accuracy.

For example, the PT pads 104 are laid out in each of A to D zones so that they are placed adjacent to each outer edge of a semiconductor integrated circuit. A route indicated by a solid arrow indicates a route of determining the layout positions of the PT pads 104. A pad laid out in a leftmost position external to the inside of the semiconductor integrated circuit region, as viewed from the outside of the semiconductor integrated circuit region, is defined as a starting point (pad marked ○), and a last position at which the number of laid-out PT pads 104 is reached is defined as an ending point. Layout positions are determined in accordance with the order of layout of I/O circuits 402.

The layout positions of WB pads 105 are determined. The layout of the WB pads 105 is determined so that the pads are adjacent to one another. Accordingly, wire bonding is simplified and bonding mistakes on the manufacture is reduced.

For example, the layout position of each WB pad 105 is determined on the core region 101 side for each of the A to D zones. A route indicated by a dotted arrow shows a route of determining the layout positions of WB pads 105. A pad laid out in a rightmost position on the core region 101 side, as viewed from the outside of the semiconductor integrated circuit region, is defined as a starting point (pad marked X), and a last position at which the number of laid-out WB pads 105 is reached is defined as an ending point. Layout positions are determined in accordance with the order of layout of I/O circuits 402. Layout information 100 of the semiconductor integrated circuit illustrated in FIG. 1 is generated by pads for the A to D zones being laid out on the layout information 100.

Figure 17:
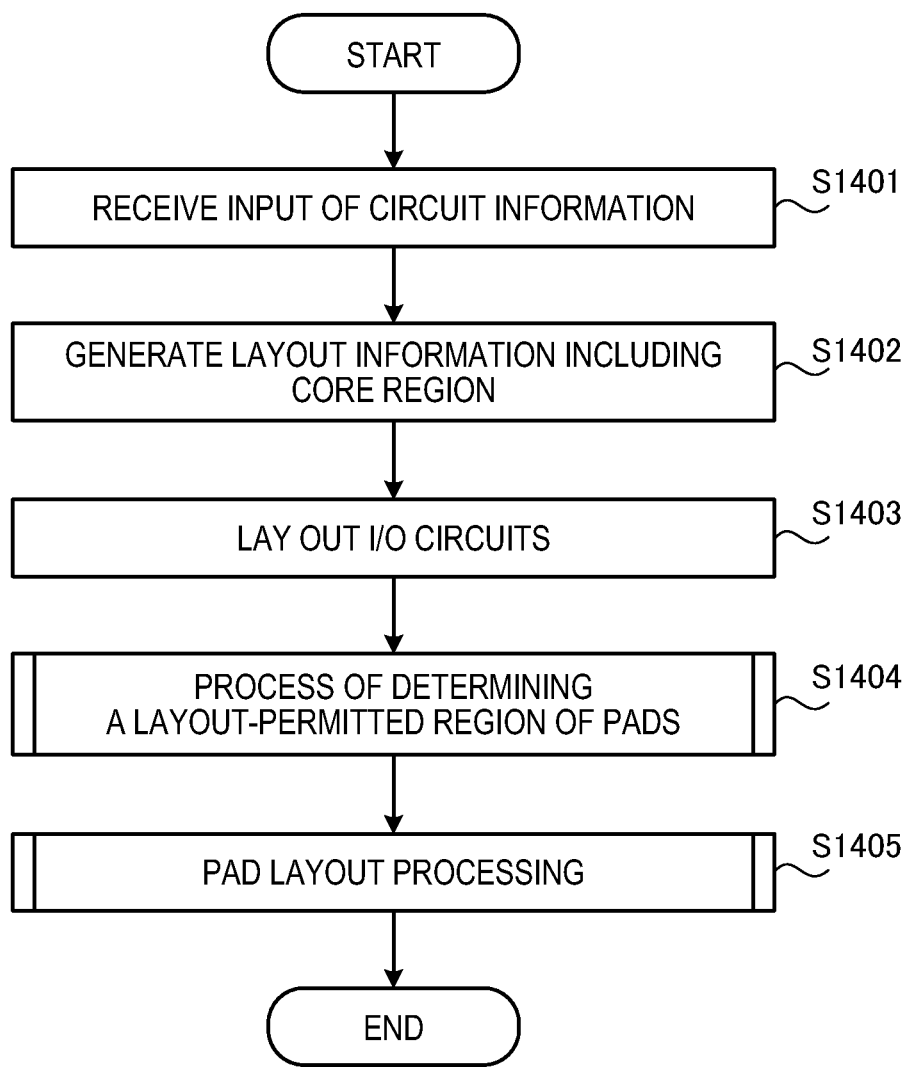
FIG. 17 illustrates an exemplary layout design processing.

FIG. 17 illustrates an exemplary layout design processing. An input section 301 receives an input of circuit information 400 (operation S1401).

A generation section 302 generates layout information 100 including a core region 101 in which a core circuit 401 included in circuit information 400 is laid out (operation S1402). A layout section 303 lays out I/O circuits 402 included in circuit information 400 on the layout information 100 (operation S1403).

A process of determining a layout-permitted region of pads is executed (operation S1404). Then, pad layout processing is executed (operation S1405). Thus, a series of processes terminates.

Figure 18:
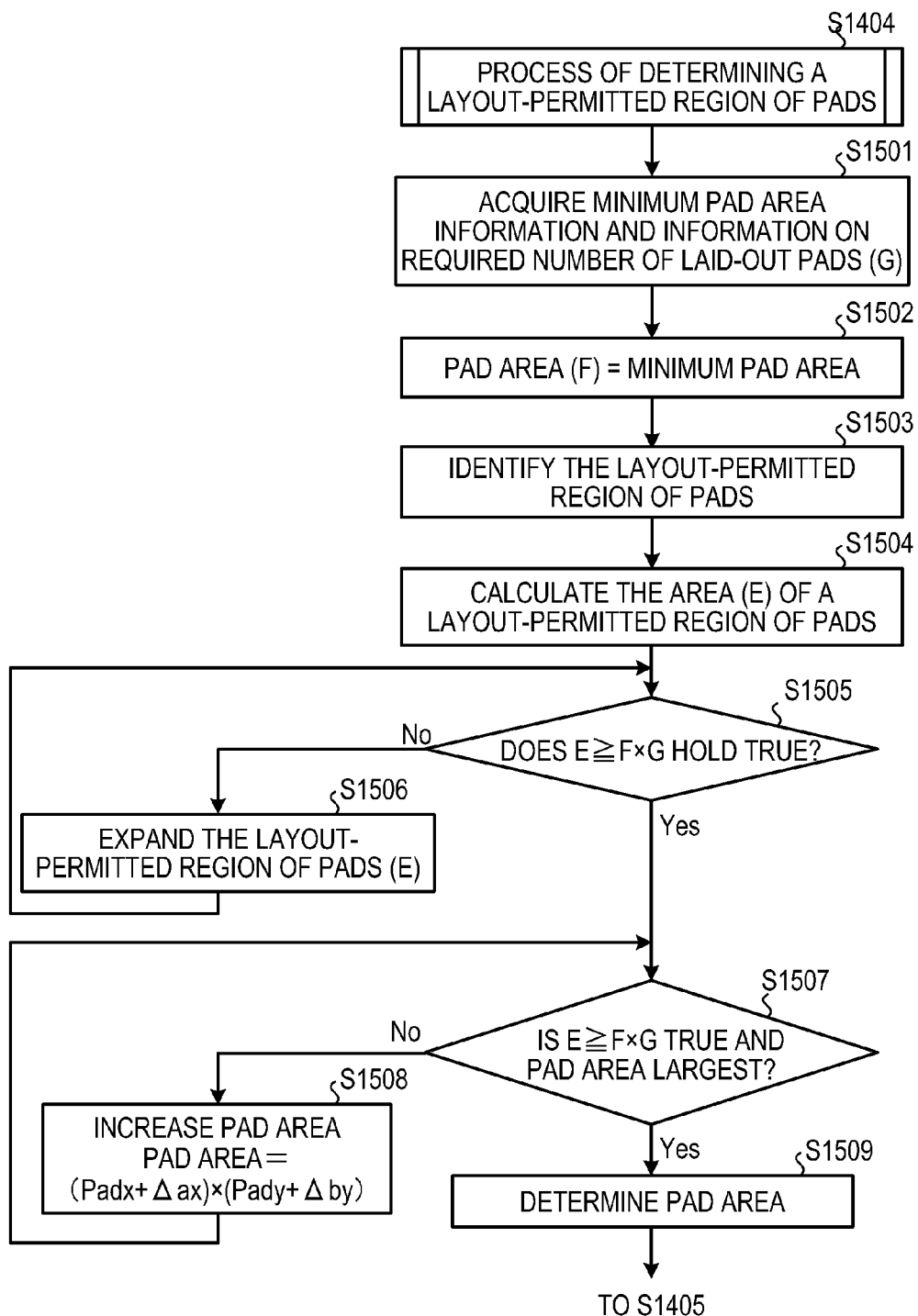
FIG. 18 illustrates an exemplary process of determining a layout-permitted region of pads.

FIG. 18 illustrates an exemplary process of determining a layout-permitted region of pads. The process of determining a layout-permitted region of pads illustrated in FIG. 18 may be operation 1404 illustrated in FIG. 17. An acquisition section 304 acquires minimum pad area information and information on a required laid-out number of pads (G) (operation S1501).

A pad area (F) is set to the minimum area of pads (operation S1502) to identify the layout-permitted region (operation S1503). A calculation section 305 calculates the area (E) of the layout-permitted region of pads (operation S1504).

A decision section 306 decides whether E≥F×G holds true or not(operation S1505). If E≥F×G does not hold true (operation S1505: No), then an expansion section 307 enlarges the layout-permitted region of pads (operation S1506) and processing returns to operation S1505. If E≥F×G holds true (operation S1505: Yes), then a decision is made whether the pad area is the maximum area at which pads may be laid out or not and whether E≥F×G is true or not (operation S1507).

If E≥F×G is true and the pad area is not the maximum area at which pads may be laid out (operation S1507: No), then the pad area is expanded using the equation "pad area=(Padx+Δax)×(Pady+Δby)" (operation S1508). Parameters Δax [μm] and Δby [μm] denote the amounts of pad expansion. Processing returns to operation S1507. If E≥F×G is true and the pad area is the maximum area (operation S1507: Yes), then the pad area is determined (operation S1509). Processing goes to operation S1405 illustrated in FIG. 17.

Figure 19:
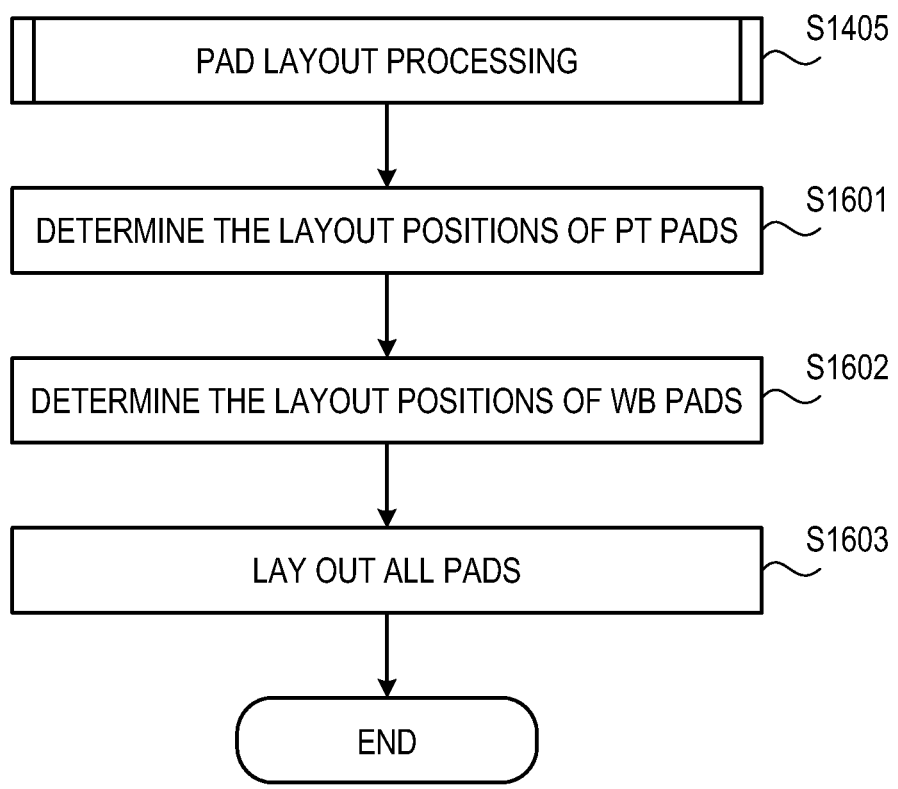
FIG. 19 illustrates an exemplary pad layout processing.

FIG. 19 illustrates an exemplary pad layout processing. The pad layout processing illustrated in FIG. 19 may be operation 1405 illustrated in FIG. 17. An allocation section 310 determines the layout positions of PT pads 104 (operation S1601). The allocation section 310 determines the layout positions of WB pads 105 (operation S1602). When all pads are laid out (operation S1603), processing terminates.

In the previous discussed embodiment, the core circuit 401 and the I/O circuits 402 are laid out based on circuit information 400 and a layout-permitted region of pads is determined. Since the layout-permitted region of pads is identified, empty regions may reduce. When the area of the layout-permitted region is equal to or larger than the total area of the required laid-out number of pads, optimization is performed so as to increase the pad area. Consequently, empty regions of a semiconductor integrated circuit are utilized in an effective manner.

Since empty regions are not produced, the area of the semiconductor integrated circuit is reduced. Furthermore, since pads are optimized, wire bonding is easily performed and, therefore, bonding mistakes on the manufacture are reduced. It becomes easy to apply a probe needle, thereby facilitating testing and improving test accuracy.

The layout design described in the embodiment(s) may be carried out as a result that a program is executed on a computer, such as a personal computer, a workstation, a specialized apparatus or processor, etc. The program is recorded on a computer-readable recording medium, such as a hard disk, a flexible disk, a CD-ROM, an MO or a DVD, and is read out from the recording medium by the computer. This program may be distributed through a network, such as the Internet.

As such, the embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

Example embodiments of the present invention have now been described in accordance with the above advantages. It will be appreciated that these examples are merely illustrative of the invention. Many variations and modifications will be apparent to those skilled in the art.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method of layout-designing a circuit based on circuit information by a computer, comprising:
    generating layout information including a core region based on the circuit information;
    laying out an I/O circuit in a region other than the core region of the layout information indicated by the circuit information;
    determining a layout-permitted region of pads included in regions other than the core region and a layout region of said I/O circuit based on the circuit information; and
    laying out the pads in the layout-permitted region, and
    wherein the layout-permitted region is determined based on a needle length specified to probe in a semiconductor testing apparatus.

2. The method according to claim 1, wherein the layout-permitted region is determined based on a wire length specified for wire bonding.

3. The method according to claim 2, comprising:
    comparing the needle length with the wire length, and
    wherein the layout-permitted region is determined based on a comparison result.

4. A method of layout-designing a circuit based on circuit information by a computer, comprising:
    generating layout information including a core region based on the circuit information;
    laying out an I/O circuit in a region other than the core region of the layout information indicated by the circuit information;
    determining a layout-permitted region of pads included in regions other than the core region and a layout region of said I/O circuit, based on the circuit information;
    laying out the pads in the layout-permitted region;
    acquiring a number of the pads and a pad area of each of the pads;
    calculating an area of the layout-permitted region and a total area of the pads based on the number of the pads and the area of the pads;
    comparing the area of the layout-permitted region with the total area and deciding whether the pads are laid out in the layout-permitted region; and
    laying out the pads in the layout-permitted region based on a result of the deciding.

5. The method according to claim 4, comprising:
    expanding the layout-permitted region when the area of the layout-permitted region is smaller than the total area; and
    comparing the area of an expanded layout-permitted region with the total area to decide whether the pads are laid out in the expanded layout-permitted region.

6. The method according to claim 4, wherein the pads are laid out in the layout-permitted region when the area of the layout-permitted region is larger than the total area.

7. The method according to claim 1, wherein a pad area is changed to a maximum area where a total area does not exceed an area of the layout-permitted region, and the changed pads are laid out.

8. The method according to claim 1, wherein pads of a same type are laid out adjacent to one another.

9. A method of layout-designing a circuit based on circuit information by a computer, comprising:
    generating layout information including a core region based on the circuit information;
    laying out an I/O circuit in a region other than the core region of the layout information indicated by the circuit information;
    determining a layout-permitted region of pads included in regions other than the core region and a layout region of said I/O circuit based on the circuit information; and
    laying out the pads in the layout-permitted region, and
    wherein the layout-permitted region is determined based on a wire length specified for wire bonding which is obtained from a constraint table.

10. The method according to claim 1, comprising deciding whether a required number of the pads is laid out in the layout-permitted region.

11. The method according to claim 10, comprising expanding the layout-permitted region, using a processor, when the layout-permitted region is smaller than a total area of a the required number of the pads.

12. The method according to claim 1, wherein the layout-permitted region is divided into zones, and the laying out of the pads uses the zones to determine a layout position of each of the pads.

13. The method according to claim 1, wherein the layout information includes a monitor region including only a transistor to measure information of said I/O circuit.

14. The method according to claim 9, wherein a pad pitch is read from the constraint table and the laying out is accomplished so that the pads align at an equal space larger than the pad pitch.

15. The method according to claim 9, wherein the constraint table is read from a memory of the computer or an external device.

* * * * *

UNITED STATES PATENT AND TRADEMARK OFFICE
CERTIFICATE OF CORRECTION

| | |
|---|---|
| PATENT NO. | : 8,637,387 B2 |
| APPLICATION NO. | : 12/614833 |
| DATED | : January 28, 2014 |
| INVENTOR(S) | : Ushiyama |

Page 1 of 1

It is certified that error appears in the above-identified patent and that said Letters Patent is hereby corrected as shown below:

In the Claims:

In Column 12, Line 35, In Claim 11, delete "a the" and insert -- the --, therefor.

Signed and Sealed this
Twenty-ninth Day of April, 2014

Michelle K. Lee
*Deputy Director of the United States Patent and Trademark Office*